United States Patent
Seidel et al.

(10) Patent No.: US 8,883,610 B2
(45) Date of Patent: Nov. 11, 2014

(54) MICROSTRUCTURE DEVICE INCLUDING A METALLIZATION STRUCTURE WITH SELF-ALIGNED AIR GAPS BETWEEN CLOSELY SPACED METAL LINES

(75) Inventors: Robert Seidel, Dresden (DE); Markus Nopper, Dresden (DE); Axel Preusse, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 582 days.

(21) Appl. No.: 12/604,703

(22) Filed: Oct. 23, 2009

(65) Prior Publication Data

US 2010/0133648 A1 Jun. 3, 2010

(30) Foreign Application Priority Data

Nov. 28, 2008 (DE) .......... 10 2008 059 650

(51) Int. Cl.
- H01L 21/76 (2006.01)
- H01L 21/768 (2006.01)
- H01L 23/532 (2006.01)
- H01L 23/522 (2006.01)

(52) U.S. Cl.
CPC ....... *H01L 21/7682* (2013.01); *H01L 21/76846* (2013.01); *H01L 21/76852* (2013.01); *H01L 23/53295* (2013.01); *H01L 23/53238* (2013.01); *H01L 21/76849* (2013.01); *H01L 23/5222* (2013.01)
USPC .......................... 438/411; 257/522

(58) Field of Classification Search
USPC .......................... 257/522; 438/411
See application file for complete search history.

(56) References Cited

U.S. PATENT DOCUMENTS

| | | | |
|---|---|---|---|
| 6,312,874 B1 * | 11/2001 | Chan et al. ..... | 430/314 |
| 6,737,725 B2 | 5/2004 | Grill et al. ..... | 257/522 |
| 6,838,354 B2 | 1/2005 | Goldberg et al. ..... | 438/408 |
| 6,838,355 B1 * | 1/2005 | Stamper et al. ..... | 438/409 |
| 2004/0213971 A1 * | 10/2004 | Colburn et al. ..... | 428/209 |
| 2006/0088975 A1 * | 4/2006 | Ueda ..... | 438/421 |
| 2007/0096319 A1 * | 5/2007 | Hsu et al. ..... | 257/750 |
| 2007/0099417 A1 * | 5/2007 | Fang et al. ..... | 438/656 |
| 2008/0169565 A1 | 7/2008 | Bonilla et al. ..... | 257/761 |

OTHER PUBLICATIONS

Translation of Official Communication from German Patent Office for German Patent Application No. 10 2008 059 650.7 dated Sep. 25, 2009.
Translation of Official Communication from German Patent Office for German Patent Application No. 10 2008 059 650.7 dated Nov. 11, 2010.

* cited by examiner

*Primary Examiner* — Zandra Smith
*Assistant Examiner* — Jamie C Niesz
(74) *Attorney, Agent, or Firm* — Amerson Law Firm, PLLC (57) ABSTRACT

In sophisticated metallization systems, air gaps may be formed on the basis of a self-aligned patterning regime during which the conductive cap material of metal lines may be protected by providing one or more materials, which may subsequently be removed. Consequently, the etch behavior and the electrical characteristics of metal lines during the self-aligned patterning regime may be individually adjusted.

11 Claims, 5 Drawing Sheets

MICROSTRUCTURE DEVICE INCLUDING A METALLIZATION STRUCTURE WITH SELF-ALIGNED AIR GAPS BETWEEN CLOSELY SPACED METAL LINES

BACKGROUND OF THE INVENTION

1. Field of the Invention

Generally, the subject matter of the present disclosure relates to microstructure devices, such as integrated circuits, and, more particularly, to metallization layers including highly conductive metals, such as copper, embedded into a dielectric material of reduced permittivity.

2. Description of the Related Art

In modern integrated circuits, minimum feature sizes, such as the channel length of field effect transistors, have reached the deep sub-micron range, thereby steadily increasing performance of these circuits in terms of speed and/or power consumption and/or diversity of circuit functions. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines and the spaces between the metal lines have to be reduced to compensate for a reduced amount of available floor space and for an increased number of circuit elements provided per unit area.

In integrated circuits having minimum dimensions in the sub-micrometer range, a limiting factor of device performance is the signal propagation delay caused by the switching speed of the transistor elements. As the channel length of these transistor elements has now reached 50 nm and less, thereby continuously enhancing transistor performance, the signal propagation delay is no longer limited by the field effect transistors but is affected, owing to the increased circuit density, by the interconnect lines, since the line-to-line capacitance (C) is increased and also the resistance (R) of the lines is increased due to their reduced cross-sectional area. The parasitic RC time constants and the capacitive coupling between neighboring metal lines, therefore, require the introduction of a new type of material for forming the metallization layer.

Traditionally, metallization layers, i.e., the wiring layers including metal lines and vias for providing the electrical connection of the circuit elements according to a specified circuit layout, are formed by providing a dielectric layer stack including, for example, silicon dioxide and/or silicon nitride with aluminum as the typical metal. Since aluminum suffers from significant electromigration at higher current densities that may be necessary in integrated circuits having extremely scaled feature sizes, aluminum is being replaced by, for instance, copper, which has a significantly lower electrical resistance and a higher resistivity against electromigration. For highly sophisticated applications, in addition to using copper and/or copper alloys, the well-established and well-known dielectric materials silicon dioxide ($k \approx 4.2$) and silicon nitride ($k > 7$) may increasingly be replaced by so-called low-k dielectric materials having a relative permittivity of approximately 3.0 and less. However, the transition from the well-known and well-established aluminum/silicon dioxide metallization layer to a copper-based metallization layer, possibly in combination with a low-k dielectric material, is associated with a plurality of issues to be dealt with.

For example, copper may not be deposited in relatively high amounts in an efficient manner by well-established deposition methods, such as chemical vapor deposition (CVD) and physical vapor deposition (PVD). Moreover, copper may not be efficiently patterned by well-established anisotropic etch processes. Therefore the so-called damascene or inlaid technique is frequently employed in forming metallization layers including copper lines and vias. Typically, in the damascene technique, the dielectric layer is deposited and then patterned for receiving trenches and via openings that are subsequently filled with copper or alloys thereof by plating methods, such as electroplating or electroless plating. Moreover, since copper readily diffuses in a plurality of dielectrics, such as silicon dioxide and in many low-k dielectrics, the formation of a diffusion barrier layer at interfaces with the neighboring dielectric material may be required. Moreover, the diffusion of moisture and oxygen into the copper-based metal has to be suppressed as copper readily reacts to form oxidized portions, thereby possibly deteriorating the characteristics of the copper-based metal line with respect to adhesion, conductivity and the resistance against electromigration.

During the filling in of a conductive material, such as copper, into the trenches and via openings, a significant degree of overfill has to be provided in order to reliably fill the corresponding openings from bottom to top without voids and other deposition-related irregularities. Consequently, after the metal deposition process, excess material may have to be removed and the resulting surface topography planarized, for instance, by using electrochemical etch techniques, chemical mechanical polishing (CMP) and the like. For example, during CMP processes, a significant degree of mechanical stress may be applied to the metallization levels formed so far, which may cause structural damage to a certain degree, in particular when sophisticated dielectric materials of reduced permittivity are used. As previously explained, the capacitive coupling between neighboring metal lines may have a significant influence on the overall performance of the semiconductor device, in particular in metallization levels, which are substantially "capacitance driven," i.e., in which a plurality of closely spaced metal lines have to be provided in accordance with device requirements, thereby possibly causing signal propagation delay and signal interference between neighboring metal lines. For this reason, so-called low-k dielectric materials or ultra low-k materials may be used, which may provide a dielectric constant of 3.0 and significantly less, in order to enhance the overall electrical performance of the metallization levels. On the other hand, typically, a reduced permittivity of the dielectric material is associated with a reduced mechanical stability, which may require sophisticated patterning regimes so as to not unduly deteriorate reliability of the metallization system.

The continuous reduction of the feature sizes, however, with gate lengths of approximately 40 nm and less, may demand even more reduced dielectric constants of the corresponding dielectric materials, which may increasingly contribute to yield loss due to, for instance, insufficient mechanical stability of respective ultra low-k materials. For this reason, it has been proposed to introduce "air gaps," at least at critical device areas, since air or similar gases may have a dielectric constant of approximately 1.0, thereby providing a reduced overall permittivity, while nevertheless allowing the usage of less critical dielectric materials. Hence, by introducing appropriately positioned air gaps, the overall permittivity may be reduced while nevertheless the mechanical stability of the dielectric material may be superior compared to conventional ultra low-k dielectrics. For example, it has been proposed to introduce nano holes into appropriate dielectric materials which may be randomly distributed in the dielectric material so as to significantly reduce the density of the dielectric material. However, the creation and distribution of the respective nano holes may require a plurality of sophisticated process steps for creating the holes with a desired density, while at the same time the overall characteristics of the dielectric material may be changed in view of the further processing, for instance with respect to planarizing surface areas, depositing further materials and the like.

In other approaches, advanced lithography processes are additionally introduced to create appropriate etch masks for forming gaps near respective metal lines with a position and size as defined by the lithographically formed etch mask. In this case, however, additional cost-intensive lithography steps may be required, wherein the positioning and the dimensioning of the corresponding air gaps may be restricted by the capabilities of the respective lithography processes. Since, typically, in critical metallization levels, the lateral dimensions of metal lines and the spacing between adjacent metal lines may be defined by critical lithography steps, an appropriate and reliable manufacturing sequence for providing intermediate air gaps may be difficult to be achieved on the basis of the available lithography techniques.

For this reason, in some approaches, self-aligned patterning regimes have been developed in which the dielectric material between closely spaced metal lines may be etched selectively to the material of the metal lines in order to obtain recesses or gaps of a desired depth. Thereafter, an appropriate dielectric material may be deposited such that at least a significant part of the interior volume of the previously formed recesses or gaps may be maintained so that corresponding air gaps are created between two adjacent metal lines. Although this technique may avoid additional lithography steps, the metal lines may be exposed to the reactive etch ambient, thereby contributing to a non-desired erosion of the metal lines. For example, in sophisticated applications, the metal lines including highly conductive metals such as copper and the like may require a reliable cap material that suppresses a diffusion of copper into the surrounding dielectric material and which also suppresses the diffusion of reactive components, such as oxygen, fluorine and the like, to the sensitive copper material. At the same time, a corresponding interface between the cap material and the copper may represent an important factor for determining the overall electrical performance of the metal line in view of its electromigration behavior. Electromigration is a phenomenon in which a significant directed "diffusion" of core atoms may occur in the direction of the electron flow direction upon occurrence of significant current densities in the metal line. In particular, increased diffusion paths may result in a significant material diffusion within the metal line, thereby contributing to a continuous deterioration and finally to a premature failure of the metal line. Consequently, great efforts have been made to provide appropriate cap materials for obtaining a strong interface between the copper and the cap material, which may provide the desired copper confinement and also exhibit superior electromigration behavior. For example, a plurality of conductive cap materials may be used in sophisticated applications which, however, may not exhibit the desired etch resistivity during the above-described self-aligned patterning regime for forming air gaps.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to methods and devices in which air gaps may be positioned between closely spaced metal regions in a self-aligned manner, while nevertheless substantially maintaining integrity of a cap material of the metal lines, which is selected in view of superior electromigration performance of the metal line. For this purpose, an additional cap material or etch protection material may be provided, at least temporarily, prior to forming corresponding recesses or gaps. Hence, the material characteristics of the additional cap layer or etch protection material may be selected such that undue material erosion of the cap layer, i.e., the layer designed for copper confinement and superior electromigration behavior, may be suppressed. At the same time, in some illustrative aspects disclosed herein, selective deposition techniques may be used in order to avoid any additional lithography processes so that self-aligned air gaps may be obtained without unduly contributing to the overall process complexity compared to conventional process techniques. Consequently, appropriate dielectric materials providing the desired characteristics may be used in sophisticated metallization levels while the reliable and reproducible formation of the air gaps at critical device areas may enable an adjustment of the overall permittivity in accordance with device requirements. At the same time, the overall electromigration behavior is substantially not compromised by the self-aligned process sequence.

One illustrative method disclosed herein comprises forming a conductive cap layer on metal lines that are formed in a first dielectric material of a metallization layer of a microstructure device. The method further comprises forming an etch protection material on the conductive cap layer, wherein the etch protection material exposes at least a portion of the first dielectric material located between two neighboring ones of the metal lines. Furthermore, the method comprises forming a recess in at least a portion of the dielectric material and depositing a second dielectric material so as to close the recess and form an air gap on the basis of the recess.

A further illustrative method disclosed herein comprises forming an etch protection material on a conductive cap layer of a first metal line and a conductive cap layer of a second metal line, wherein the first and second metal lines are formed in a dielectric material of a metallization system of a microstructure device. The method further comprises forming a recess in the dielectric material between the first metal line and the second metal line by using the etch protection material as a mask. Additionally, the etch protection material is removed at least from the conductive cap layers and finally an air gap is formed between the first and second metal lines on the basis of the recess.

One illustrative microstructure device disclosed herein comprises a first metal line formed in a dielectric material of a metallization layer wherein the first metal line comprises a first conductive cap layer forming a first interface with a first metal core material of the first metal line. The microstructure device further comprises a second metal line formed in the dielectric material of the metallization layer laterally adjacent to the first metal line, wherein the second metal line comprises a second conductive cap layer forming a second interface with a second metal core material of the second metal line. Finally, the microstructure device comprises a single continuous air gap located in the dielectric material between the first and second metal lines.

BRIEF DESCRIPTION OF THE DRAWINGS

The disclosure may be understood by reference to the following description taken in conjunction with the accompanying drawings, in which like reference numerals identify like elements, and in which:

FIG. 1c schematically illustrates the microstructure device according to further illustrative embodiments in which a selective deposition behavior may be achieved and obtained on the basis of surface treatment, mask layers and the like;

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides techniques and microstructure devices, for instance integrated circuits, in which electrical performance of a metallization system may be enhanced by providing self-aligned air gaps in the vicinity of critical metal regions, such as metal lines, while maintaining the superior characteristics of the metal lines with respect to electromigration and metal confinement. That is, the positioning and lateral size of respective air gaps or air channels may be obtained on the basis of a self-aligned patterning regime in combination with a deposition process without requiring sophisticated lithography techniques, while at the same time integrity of a dedicated cap material, such as a conductive cap material, may be maintained during the patterning process. For this purpose, one or more additional cap materials or etch protection materials may be provided in a highly selective manner without requiring additional lithography steps, so that undue material erosion of the dedicated cap layers during the patterning process may be substantially avoided. Moreover, since the one or more additional cap layers or etch protection materials may have significantly different material characteristics compared to dedicated cap layers, for instance in view of material thickness, material composition and the like, controllability of the patterning process may be accomplished without requiring any modifications of a desired configuration of the metal line and the dedicated cap layer. For example, an increase of layer thickness of conventional cap layer, which may be considered in view of increasing the overall etch resistivity, may be avoided, thereby providing enhanced uniformity of electrical performance of the corresponding metallization system and also enhanced uniformity of the subsequent patterning process. Moreover, the additional etch protection layer or layers may be efficiently removed during the further processing, at least partially, if the presence of these materials may be considered inappropriate for the further processing of the device and/or for the performance of the device. Hence, lateral dimensions of the air gaps may be adjusted without additional lithography techniques, even with sub-lithography resolution, wherein the provision of the additional etch protection materials may provide a reliable and reproducible overall process sequence. Moreover, a high degree of flexibility may be achieved with respect to selecting appropriate materials, since a plurality of selective deposition techniques may be used, such as electrochemical deposition process, that is, electroless plating, CVD-like deposition processes and the like, wherein a selective deposition behavior may be accomplished by functionalizing surface portions, for instance by providing a hydrophilic surface condition on dielectric materials by providing mask materials and the like. Furthermore, since, in some illustrative aspects disclosed herein, undesired residues of the etch protection material may be efficiently removed in a later manufacturing stage, a less pronounced etch selectivity of these materials may readily be compensated for by appropriately adjusting an overall initial layer thickness so as to reliably maintain integrity of the dedicated cap materials of the metal lines.

Since the present disclosure relates to techniques and devices which may enable the positioning and dimensioning of air gaps with sub-lithographical resolution, the principles disclosed herein may be highly advantageously applied to sophisticated microstructure devices, such as semiconductor devices including transistor elements of the 45 nm technology or the 32 nm technology and beyond. The principles disclosed herein, however, may also be applied to less critical microstructure devices in which reduced permittivity may be desirable, for instance by avoiding highly sensitive dielectric materials, so that the present disclosure should not be considered as being restricted to specific critical device dimensions unless such restrictions are explicitly set forth in the appended claims or the specification.

Figure 1A:
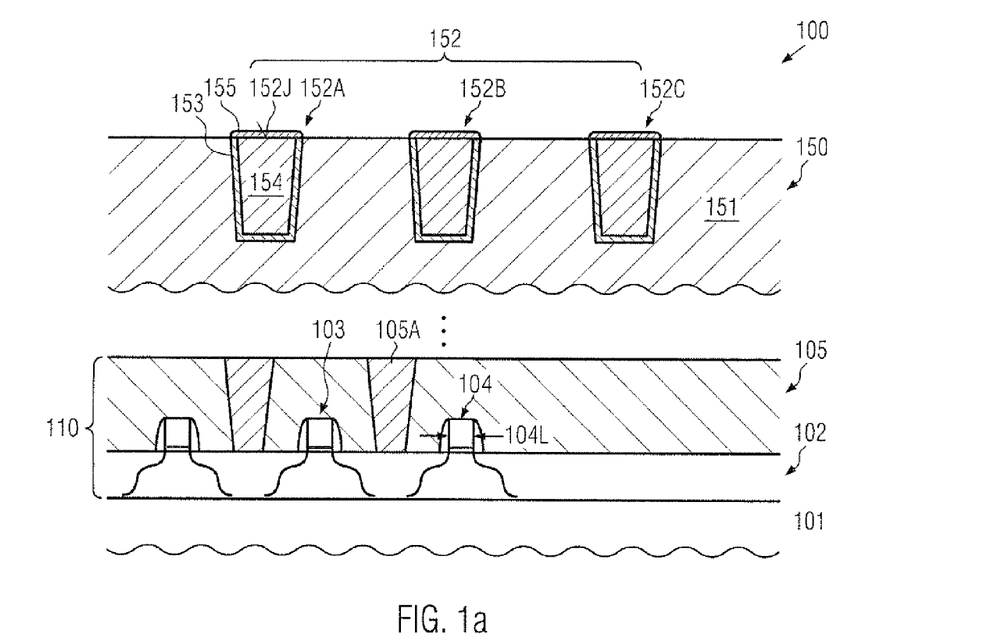
FIG. 1a schematically illustrates a cross-sectional view of a microstructure device, for instance an integrated circuit, that comprises a device level and a metallization system which is to receive air gaps between closely spaced metal lines while maintaining integrity of a cap material, according to illustrative embodiments.

FIG. 1a schematically illustrates a cross-sectional view of a microstructure device 100 which, in the embodiment shown, may represent an integrated circuit including a plurality of circuit elements, such as transistors, capacitors, resistors and the like. In this case, the device 100 may comprise a device level 110 in which a plurality of circuit elements 103, such as transistors and the like, may be formed above a substrate 101. For example, the substrate 101 may represent a semiconductor substrate, an insulating substrate having formed thereon an appropriate semiconductor layer 102, in and above which are formed the circuit elements 103. In other cases, a buried insulating layer (not shown) may be provided, at least partially, between the semiconductor layer 102 and the substrate 101 in order to form a silicon-on-insulator (SOI) configuration. It should be appreciated that the semiconductor material of the layer 102 may comprise any appropriate material, such as silicon, germanium, a silicon/germanium mixture, compound semiconductor materials and the like, as may be required to obtain the desired device characteristics. The circuit elements 103, when provided in the form of transistor elements, may comprise a gate electrode structure 104, which may affect the overall characteristics and which may have a critical lateral dimension, indicated as 104L, which may be approximately 50 nm and less, such as 30 nm and less in highly sophisticated semiconductor devices. The device level 110 may further comprise a contact level 105, which may be considered as an interface between the circuit elements 103 and a metallization system 150. The contact level 105 may comprise any appropriate dielectric material, such as silicon dioxide, silicon nitride and the like, in combination with contact elements 105A which provide the electrical connection between contact areas of the circuit elements 103 and metal regions in the metallization system 150. It should be appreciated that the configuration of the device level 110 may vary, depending on the overall device requirements. Thus, the principles disclosed herein should not be considered as being restricted to specific device architectures, unless such restrictions are explicitly set forth in the specification or the appended claims.

As previously explained, typically, one or more electrical connections may be associated with each of the circuit elements 103, thereby requiring a plurality of metallization layers for establishing the electrical connections corresponding to the circuit layout under consideration wherein, for convenience, a portion of a single metallization layer may be illustrated as the metallization system 150. It should be appreciated, however, that below and/or above the metallization layer 150, one or more additional metallization layers may be provided, depending on the overall complexity of the device 100. For any of these additional metallization layers, the same criteria may apply as will be described later on with reference to the metallization layer 150.

The metallization layer 150 may comprise a dielectric material 151, which may be provided in the form of any appropriate material or material composition so as to obtain the desired electrical and mechanical characteristics. For example, the dielectric material 151 may comprise a material having a moderately low permittivity while also providing sufficient mechanical robustness in view of the further processing of the device 100, as previously explained. Since the final permittivity of the metallization layer 150 may be adjusted, at least locally, on the basis of air gaps to be formed in certain locations, the selection of an appropriate dielectric material may preferably be based on the compatibility in view of the subsequent processing rather than on the basis of a minimum dielectric constant. For instance, a plurality of well-established dielectric materials with a moderately low dielectric constant in the range of approximately 4.0-2.5 may be used in the metallization layer 150, according to illustrative embodiments. For example, doped silicon dioxide, silicon carbide, a plurality of silicon, oxygen, carbon and hydrogen-containing materials and the like may be efficiently used. In other cases, appropriate polymer materials may be used for the metallization layer 150, as long as the desired compatibility with the further processing may be achieved. It should be appreciated that the dielectric material 151 may comprise a plurality of different materials, depending on the overall device and process requirements. For example, intermediate etch stop materials and the like may be provided, if deemed appropriate for the overall performance and for the further processing of the device 100.

The metallization layer 150 may further comprise a plurality of metal lines 152A, 152B, 152C, which may also be referred to commonly as metal lines 152, if appropriate. For instance, the metal lines 152 may comprise a highly conductive core material 154, such as copper and the like, when enhanced performance with respect to conductivity, electromigration and the like is required. In other cases, other metals, such as copper alloys, silver and the like, may be used if these materials are compatible with the desired device characteristics. Furthermore, the metal lines 152 may comprise a conductive barrier material 153 which may include, in some illustrative embodiments, two or more sub-layers so as to provide enhanced metal confinement and integrity of the metal with respect to a reaction with reactive components, which may be present in minute amounts within the dielectric material 151. Furthermore, typically, the conductive barrier material 153 may result in superior electromigration behavior of the metal lines 152. Moreover, a cap layer 155 is formed on the metal lines 152 in order to provide the required copper confinement and copper integrity, while also resulting in superior electromigration behavior, as previously discussed. For example, a plurality of conductive cap materials, such as nickel, cobalt, a nickel/molybdenum/phosphorous-containing alloy, a cobalt/tungsten/phosphorous-containing alloy, a nickel/tungsten/phosphorous-containing alloy, ruthenium and the like, may be used as dedicated cap materials providing superior electromigration behavior while not unduly affecting electrical performance in view of overall conductivity. Consequently, the material characteristics of the cap layer 155 may be selected so as to form a strong interface 152J with the core material 154 to obtain superior electromigration behavior, while at the same time an appropriate thickness may be selected in accordance with the overall device requirements. As previously explained, the materials of the cap layer 155 may be selected in view of electromigration and conductivity, while the aspect of etch selectivity may not have to be taken into consideration due to the provision of one or more additional etch protection materials during the further processing of the device 100.

In some illustrative embodiments, the metal lines 152 may be considered as "closely spaced" metal lines wherein a lateral dimension of the individual metal lines 152 may be comparable to the lateral distance between two neighboring metal lines, such as the metal lines 152A, 152B or 152B, 152C. For example, the metallization layer 150 may comprise metal lines of a width of several hundred nanometers and significantly less, such as 100 nm and less, while also a spacing between neighboring metal lines may be on the same order of magnitude. In this case, the metal lines 152 may have "critical dimensions," i.e., dimensions that may represent the minimum lateral dimensions that may be reliably and reproducibly obtained by corresponding lithography techniques in combination with the associated patterning regimes. Thus, contrary to some conventional approaches, the positioning and dimensioning of any air gaps between adjacent metal lines 152 may be accomplished in a self-aligned manner by using the metal lines as "etch masks" wherein, however, enhanced integrity of the cap materials 155 may be accomplished on the basis of additional cap materials or etch protection materials, as will be described later on in more detail.

The device 100 as shown in FIG. 1a may be formed on the basis of the following processes. The device level 110 may be formed by using well-established process techniques, wherein sophisticated lithography processes, patterning strategies and the like may be used to provide the circuit elements 103 in accordance with design rules. For instance, the gate electrode 104 may be formed by advanced lithography and etch techniques, thereby adjusting the gate length 104L according to design rules. Furthermore, a dopant profile in the semiconductor layer 102 may be adjusted on the basis of well-established implantation techniques in combination with anneal processes. After completing the basic structure of the circuit elements 103, the contact level 105 may be formed in accordance with appropriate manufacturing techniques, for instance by depositing a dielectric material, planarizing the same and forming contact openings therein, which may finally be filled with an appropriate conductive material to obtain the contact elements 105A. Thereafter, one or more metallization layers may be formed in accordance with any appropriate manufacturing techniques, such as inlaid or damascene techniques, as previously described. For convenience, a manufacturing sequence may be described with reference to the metallization layer 150, in which the metal lines 152 may be formed so as to connect to respective vias (not shown) which may have been formed in a lower-lying portion of the metallization layer 150 in a separate manufacturing sequence or which may be formed commonly with the metal lines 152. It should be appreciated that the present disclosure may be implemented in combination with any appropriate manufacturing sequence for forming the metal lines 152. For example, the dielectric material 151 may be deposited by any appropriate deposition technique, such as CVD, spin-on processes, PVD, or any appropriate combination of these techniques. It should be appreciated that the dielectric material 151 may comprise an etch stop or cap layer so as to cover metal regions of a lower-lying metallization level and/or act as an etch stop material for forming via openings or trenches for the metal lines 152, depending on the overall process strategy. Thereafter, an appropriate etch mask, possibly in the form of a hard mask, may be provided by lithography to define the lateral size and position of the metal lines 152. It should be appreciated that the lateral size and the spacing of adjacent metal lines 152 may significantly vary, even in the same metallization level, depending on the overall layout of the underlying device level 110. As previously discussed, the metal lines 152, as shown in FIG. 1a, may represent closely spaced metal lines in some illustrative embodiments, wherein the lateral size and the spacing may represent critical dimensions for the lithography and patterning regime under consideration. Based on the corresponding etch mask, respective openings may be formed and may subsequently be filled with an appropriate material, such as the barrier material 153 and the core material 154 in the form of copper, copper alloy, silver and the like. The deposition of the barrier material 153 may be accomplished by using sputter deposition, electrochemical deposition, CVD, atomic layer deposition (ALD) and the like. Typically, the deposition of the core material 154 may be accomplished on the basis of electrochemical deposition techniques, such as electroless plating, electroplating and the like. Thereafter, any excess material may be removed by an appropriate removal process, such as chemical mechanical polishing (CMP) and the like. Thereafter, the dedicated cap layer 155 may be formed on the core materials 154, which in some illustrative embodiments may typically be accomplished without additional lithography processes. For example, a self-aligned electrochemical deposition process may be performed in which the core material may serve as a catalyst material for initiating the chemical reaction for depositing the material of the cap layers 155 from a corresponding electrolyte solution. In other cases, CVD-like deposition techniques may be used, for instance in combination with an appropriate functionalizing of the dielectric material 151 so as to substantially avoid the deposition of the cap material on the dielectric material and/or to enable a selective removal of cap material from above the dielectric material 151. In still other cases, a further lithography process may be used to pattern the previously deposited cap material.

Figure 1B:
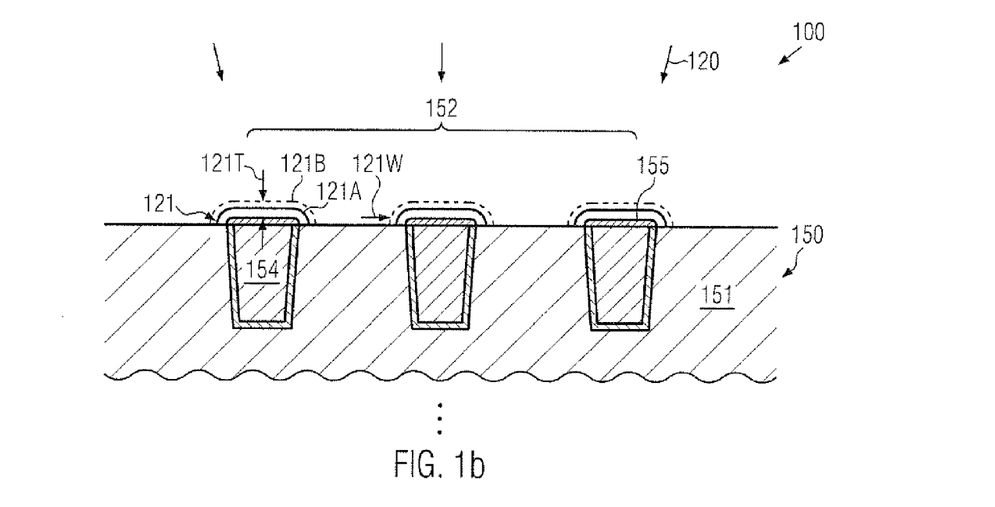
FIG. 1b schematically illustrates a cross-sectional view of the microstructure device during a deposition process for selectively forming one or more cap materials or etch protection materials above the metal lines, according to illustrative embodiments.

FIG. 1b schematically illustrates a cross-sectional view of a portion of the device 100, i.e., a portion of the metallization system 150. In this context, it should be appreciated that, in some illustrative embodiments, the metallization system 150 may be formed above an appropriate substrate without a corresponding device level, such as the device level 110, as illustrated in FIG. 1a. In this case, the metallization system 150 may be transferred to a corresponding device level at any appropriate manufacturing stage. In FIG. 1b, the device 100 is subjected to a deposition sequence 120 that is designed to form one or more additional materials above the cap layer 155 in order to substantially maintain integrity of the cap layers 155 during the further processing in forming self-aligned air gaps between the metal lines 152. In the embodiment shown, an etch protection material 121 may be formed with respect to the required etch resistivity, as previously discussed. For example, a single appropriate material composition may be formed in a spatially selective manner by the process sequence 120 so as to reliably cover the cap layer 155. For example, any appropriate conductive material may be deposited with an appropriate thickness 121T to provide the desired integrity of the cap layer 155 during the subsequent processing, wherein a different material composition may be selected compared to the dedicated cap material 155 to enable an efficient and well-controllable removal of at least a significant portion of the material 121 in a later manufacturing stage. For example, in some illustrative embodiments, an electroless plating process may be used in the sequence 120, wherein an appropriate electrolyte solution may be used, while the cap material 155 may act as a catalyst material to initiate the electrochemical deposition. A plurality of materials, for instance as also specified above with respect to the cap material 155, may be available and corresponding deposition recipes may be used. It should be appreciated, however, that the difference in the material composition between the materials 121 and 155 may provide a desired etch selectivity during the further processing, when the cap layer 155 is to be exposed in order to gain the desired device characteristics with respect to the electrical performance of the metal lines 152. That is, as previously explained, the cap layer 155 may be selected in view of electrical performance which may thus be "re-established" by removing the etch protection material 121 in a later manufacturing stage, substantially without negatively affecting the cap layer 155. In some illustrative embodiments, the etch protection material 121 may be provided in the form of two or more individual material compositions, for instance as illustrated in FIG. 1b, by layers 121A, 121B, which may be advantageous during the subsequent removal of the material 121. For example, the material layer 121A may act as a buffer material or etch stop material for the removal of the material 121B in a later manufacturing stage, while the material 121A may also be efficiently removed with respect to the cap material 155 by appropriately selecting the removal characteristics thereof. For instance, the material 121B may have a similar composition compared to the cap material wherein, however, a thickness thereof may be appropriately selected to provide the desired integrity of the cap layer 155, while on the other hand the layer 121A may provide appropriate etch stop capabilities in removing any residues of the layer 121B after the patterning sequence for forming recesses adjacent to the metal lines 152. Consequently, a high degree of flexibility in selecting appropriate materials may exist, since many materials may be efficiently deposited by selective electrochemical deposition techniques, wherein the corresponding removal characteristics and etch resistivity may be adjusted by selecting the material composition and the thickness, wherein a plurality of different material compositions may be used, if appropriate. Furthermore, since most of the etch protection material 121 may be provided in a temporary manner, the deposition parameters may be adjusted to obtain a desired lateral growth or width 121W, which may result in a desired degree of shadowing the dielectric material during the subsequent patterning regime for forming recesses in the dielectric material 151. That is, by adjusting the lateral width 121W, a spacer effect of the material 121 may be accomplished, which may thus allow adjusting the width of the corresponding recesses in anisotropic etch procedures, which may be desirable in maintaining a certain degree of mechanical stability and also in maintaining integrity of the barrier material 153, if a direct contact of this material with a corresponding etch ambient may not be desirable.

Figure 1C:
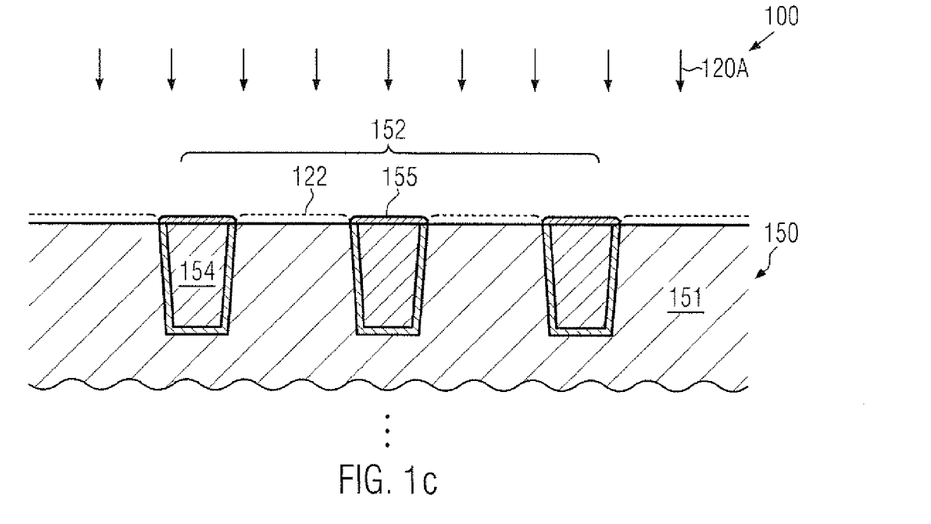

FIG. 1c schematically illustrates the device 100 when exposed to a process sequence 120A that is designed to prepare exposed surface areas of the metallization layer 150 for a substantially spatially selective deposition of the one or more etch protection materials 121 (FIG. 1b). In one illustrative embodiment, the process sequence 120A may include a surface treatment for functionalizing the exposed surface area in order to adjust the deposition rate for the dielectric material 151 and the cap layer 155 differently for a subsequent deposition process. For instance, the functionalizing of both surface areas may include the deposition of a "passivation layer" which may impart a substantially hydrophobic characteristic to the cap layer 155, while a subsequent treatment, for instance in the form of a reactive component, may result in a substantially hydrophilic surface characteristic of the dielectric material 151. In this case, an appropriate material may be selectively deposited, as indicated by 122, which may adhere to the hydroxyl groups of the hydrophilic surface of the dielectric material 151, while a deposition thereof on the cap layer 155 having the hydrophobic surface characteristic may be substantially avoided. Thereafter, after cleaning the exposed surface areas, a desired etch protection material 121 may be deposited, for instance by a CVD-like deposition technique, wherein the etch protection material may be removed from above the dielectric material 151 together with the previously deposited mask material 122, for instance by applying elevated temperatures and the like. In still other illustrative embodiments, the mask material 122 may itself have a surface characteristic so as to substantially suppress significant deposition of the etch protection material thereon. Also, in this case, a selective masking effect may be obtained during the further processing, since the mask material 122 may have a higher removal rate compared to the etch protection material that may be selectively formed above the cap layers 155. In still other illustrative embodiments, the sequence 120A may comprise the deposition of a resist material, which may be exposed, wherein the different optical behavior of the metal lines 152 with respect to the dielectric material 151 may result in a corresponding creation of latent images so that, depending on the type of resist material used and the corresponding exposure parameters, a resist material may be selectively removed from above the cap material or from above the dielectric material 151. Thereafter, the etch protection material or any other mask material may be provided by any appropriate deposition technique and thereafter remaining resist material, possibly in combination with a corresponding etch protection material formed thereon, may be removed by heat treatment and the like.

Figure 1D:
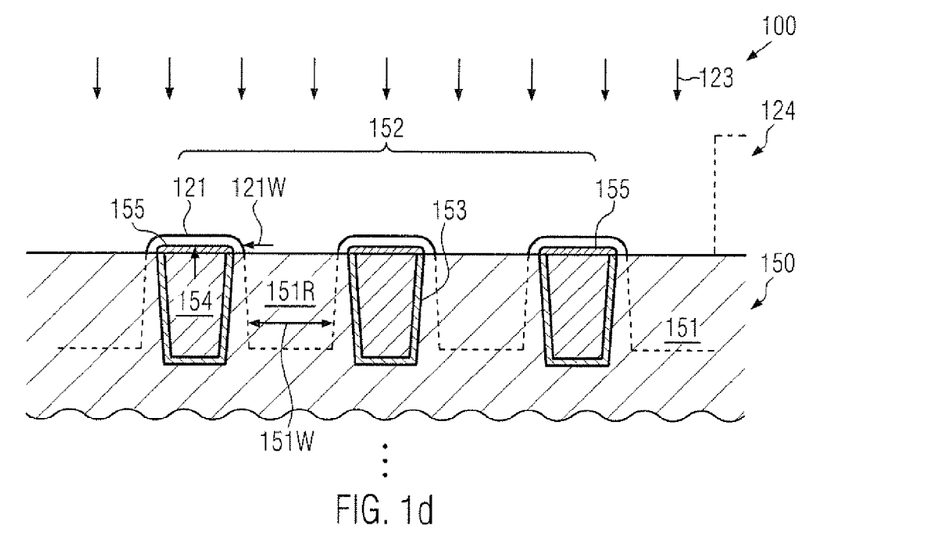
FIG. 1d schematically illustrates the microstructure device during a patterning process for forming respective recesses by using the etch protection material for maintaining integrity of the capped metal lines while other device areas may be masked, according to illustrative embodiments.

FIG. 1d schematically illustrates the device 100 in a further advanced manufacturing stage. As illustrated, the device 100 may be exposed to an etch ambient 123 designed to form corresponding recesses 151R between adjacent two of the metal lines 152. Furthermore, an etch mask 124 may be provided, for instance in the form of a resist mask and the like, in order to cover corresponding device regions in which the formation of the recesses 151R or a corresponding material removal of the layer 151 may not be desired. During the etch process 123, which in some illustrative embodiments may be designed as an anisotropic plasma assisted etch process, the etch protection material 121 may maintain integrity of the cap layer 155, even if a significant amount of the material 121 may in some cases be consumed during the process 123. As previously explained, a corresponding material consumption may be taken into consideration by appropriately selecting the initial layer thickness of the material 121. Moreover, when using a highly anisotropic etch behavior, the width 151W of the recess 151R may be adjusted on the basis of the material 121 by adjusting the width 121W. For example, a plurality of well-established anisotropic etch recipes may be used, depending on the material composition of the layer 151. In other illustrative embodiments an isotropic etch recipe may be used if exposure of the barrier layer 153 of the metal lines 152 may not negatively affect the functional behavior thereof and if an increased width of the recesses 151R may be desired, for instance in view of increasing the overall volume of respective air gaps to be formed on the basis of the recesses 151R.

Figure 1E:
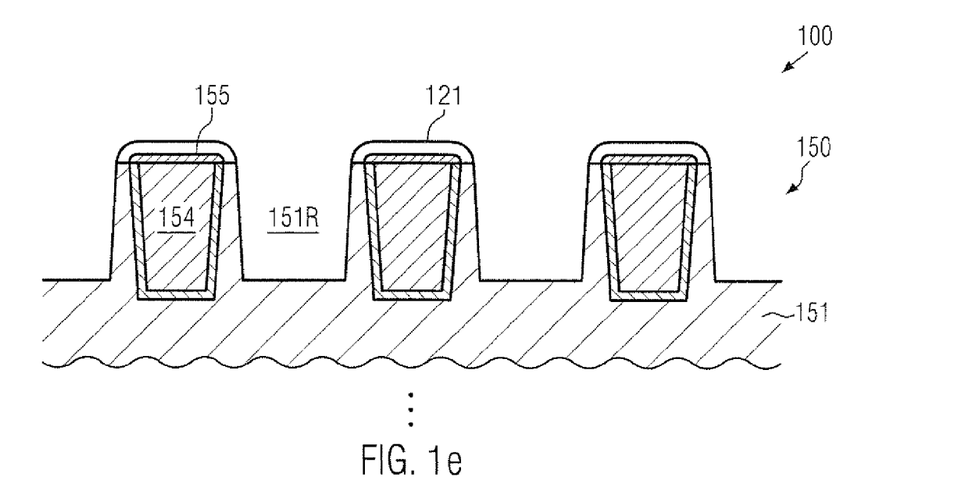
FIGS. 1e-1g schematically illustrate cross-sectional views of the microstructure device during various manufacturing stages for forming air gaps on the basis of the previously patterned recesses, according to illustrative embodiments.

FIG. 1e schematically illustrates the device 100 after the end of the etch process 123 (FIG. 1d). As illustrated, the recesses 151R may extend into the dielectric material 151 down to a desired depth, while the cap layers 155 are still covered by a portion of the material 121 that is not consumed during preceding etch processes. In some illustrative embodiments (not shown), the width of the recesses 151R may further be adapted by depositing a spacer material of any appropriate composition and subsequently anisotropically etching the spacer material to form corresponding "sidewall spacers" within the recesses 151R, thereby obtaining any desired width of air gaps still to be formed on the basis of the recesses 151R. In this manner, any desired lateral size of the recesses 151R and thus of the corresponding air gaps may be determined without requiring sophisticated lithography processes. It should be appreciated that, during a corresponding patterning process for forming sidewall spacers in the recesses 151R, the remaining material 121 may also act as an etch stop layer for maintaining integrity of the cap layers 155.

Figure 1F:
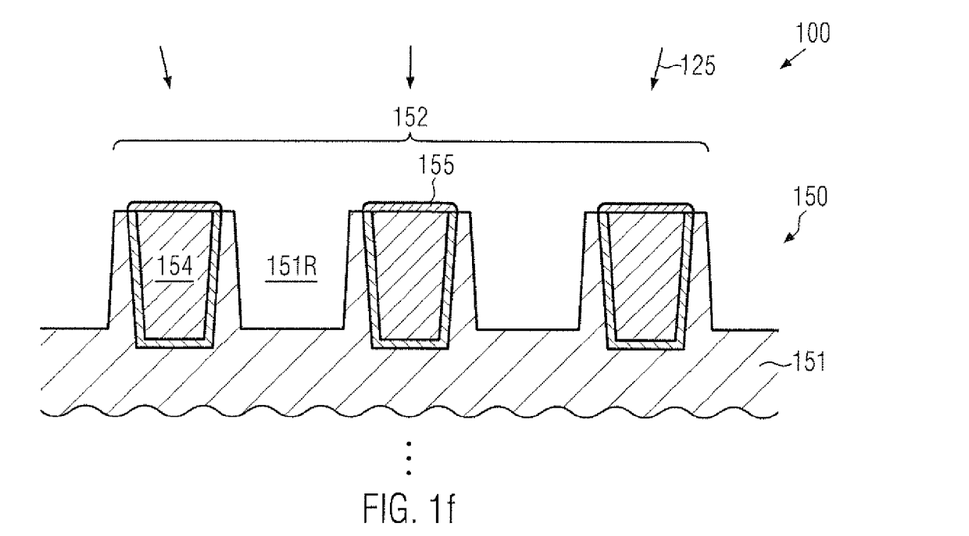

FIG. 1f schematically illustrates the device 100 according to further illustrative embodiments in which the residues of the material 121 (FIG. 1e) may be removed prior to forming corresponding air gaps on the basis of the recesses 151R. For this purpose, an etch process 125 may be performed, for instance on the basis of wet chemical etch recipes, plasma assisted etch techniques, such as isotropic or anisotropic etch techniques, and the like. During the etch process 125, undue material erosion of the cap layers 155 may be suppressed, since a certain degree of etch selectivity may exist due to the different material compositions of the etch protection material 121 or the residue thereof and the cap layer 155. In some illustrative embodiments, as previously discussed, even a pronounced etch selectivity may be accomplished, for instance by selecting appropriate materials or providing a corresponding etch stop material, such as the layer 121A (FIG. 1b). Consequently, prior to further processing of the device 100, a desired configuration of the metal lines 152 may be re-established by removing the material 121, thereby providing the desired electrical performance of the metal lines 152.

Figure 1G:
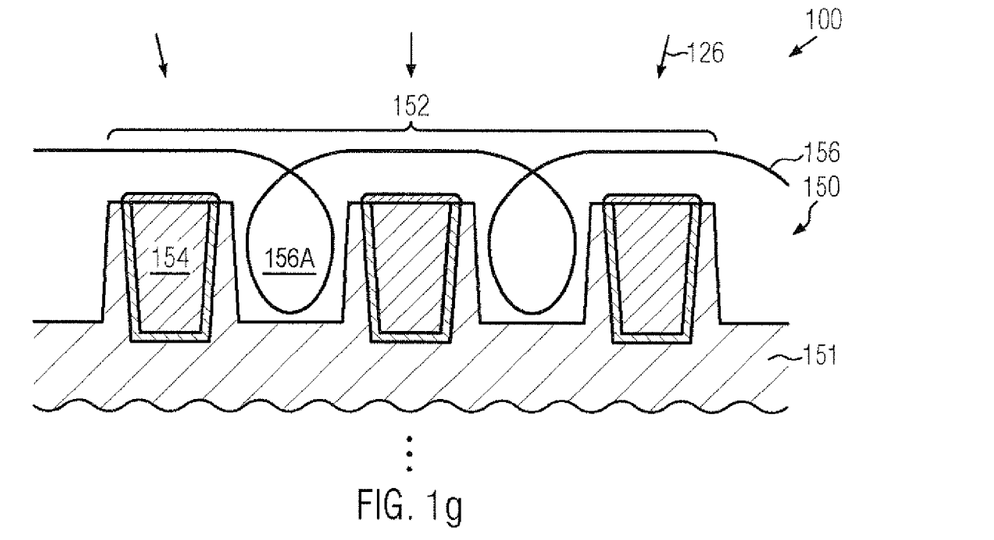

FIG. 1g schematically illustrates the device 100 during a deposition process 126 that is designed to deposit a further dielectric material 156 so as to obtain corresponding air gaps 156A on the basis of the recesses 151R (FIG. 10. For this purpose, the deposition process 126 may be performed on the basis of deposition parameters which may result in the formation of pronounced overhangs, thereby reliably closing the air gaps 156A. Hence, a plurality of well-established CVD-based recipes may be used in combination with an appropriate material, such as silicon dioxide, silicon carbide, silicon nitride or any dielectric materials of reduced permittivity, which, however, may provide the desired mechanical stability and the like. Thereafter, the further processing may be continued by, for instance, removing any excess material of the layer 156 and planarizing the surface topography and forming one or more additional metallization layers, which may also receive, at least locally, corresponding air gaps, depending on the overall device requirements.

Figure 1H:
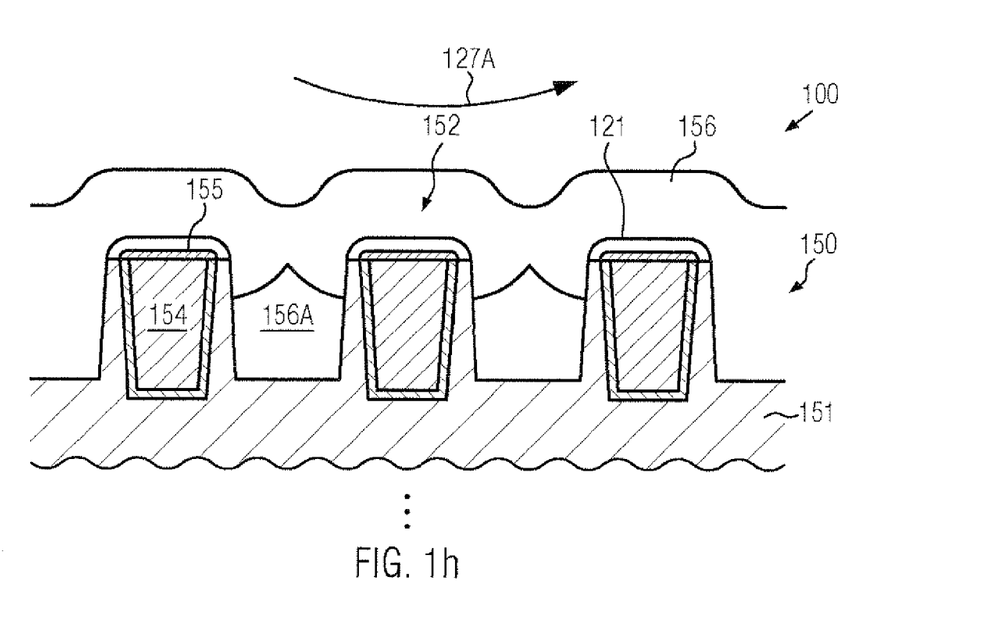
FIGS. 1h-1i schematically illustrate cross-sectional views of the microstructure device according to still further illustrative embodiments in which at least a portion of the etch protection material may be removed by a planarization technique.

FIG. 1h schematically illustrates the device 100 according to further illustrative embodiments. As illustrated, the dielectric material 156 is formed above the metal lines 152, which may still have formed thereabove the etch protection material 121 or at least a portion that has not been consumed during the preceding patterning process. Moreover, the device 100 may be subjected to a material removal process 127A in which excess material of the layer 156 may be removed, thereby also planarizing the surface topography of the device 100. For example, the removal process 127A may comprise a CMP process which may be performed on the basis of appropriate process parameters in order to efficiently remove material of the layer 156. During the removal process 127A, the material 121 may, in some illustrative embodiments, be used as a CMP stop material or as a CMP control material, since the material 121 may have significantly different material characteristics compared to the dielectric material 156. Thus, exposure of the material 121 may be detected during the removal process 127A and may be used as an efficient process control. Thereafter, the removal process 127A may be continued, for instance, on the basis of different process parameters to also remove the layer 121, at least above the cap layer 155.

Figure 1I:
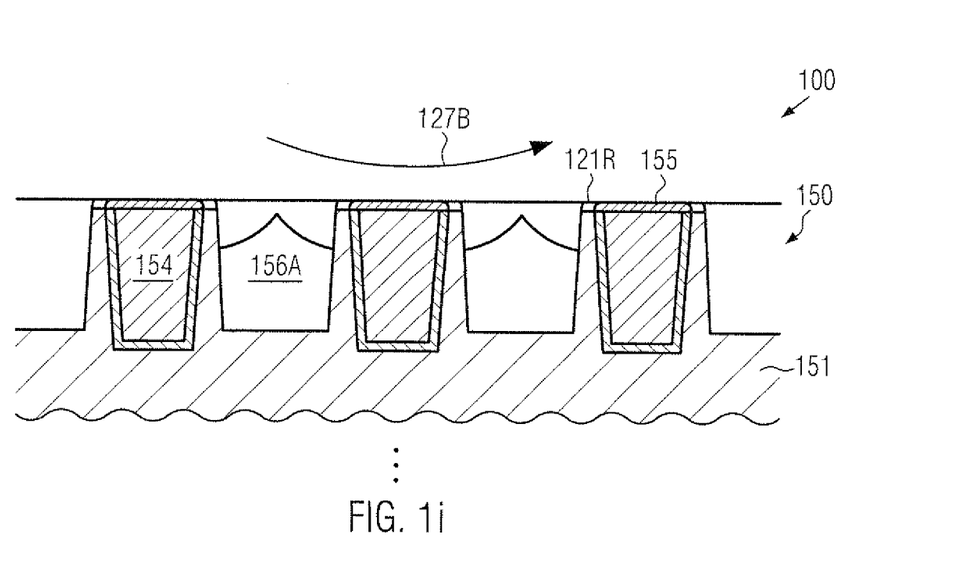

FIG. 1i schematically illustrates the device 100 during a corresponding removal process 127B in which material of the layer 121 may be removed in a highly controllable manner relative to the cap material 155. It should be appreciated that corresponding residues 121R that may be positioned laterally adjacent to the cap material 155 may substantially not affect performance of the metallization system 150 and the further processing of the device 100.

As a result, the present disclosure provides microstructure devices and corresponding manufacturing techniques in which self-aligned air gaps may be provided wherein sophisticated electromigration performance may be maintained while at the same time integrity of the metal lines during the patterning of the self-aligned air gaps may be ensured. For this purpose, the metal lines may be covered by at least one or more additional cap materials or etch protection material, the characteristics of which may be selected in view of providing the desired etch resistivity while the actual first cap layer provides the desired electrical performance of the metal lines. Furthermore, in some illustrative embodiments, the thickness of the additional etch protection layer may also provide a spacer-like shadowing effect during the patterning process, thereby suppressing exposure of a conductive barrier material or copper material when forming the corresponding recesses. Hence, the hard mask capabilities during the pattering process may be individually adjusted without affecting the electrical behavior of the metal lines, for instance with respect to capacitive coupling, electromigration and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
performing a first selective deposition process to form a conductive cap layer selectively on each of a plurality of metal lines formed in a first dielectric material of a metallization layer of a microstructure device;
performing a second selective deposition process so as to form a first etch protection material in a spatially selective manner on each conductive cap layer so as to cover an entirety of each conductive cap layer and protect the conductive cap layer in a subsequent recess etching process, said first etch protection material exposing at least a portion of said first dielectric material between two neighboring ones of said metal lines;
performing a third selective deposition process so as to form a second etch protection material in a spatially selective manner on each of said first etch protection materials;
with the first and second etch protection materials covering the conductive cap layers, performing the recess etching process to form a recess in said at least a portion of said first dielectric material; and depositing a second dielectric material so as to close said recess and form an air gap on the basis of said recess.

2. The method of claim 1, wherein the first and second etch protection material formed on each of the two neighboring ones of said metal lines is positioned above a portion of the dielectric material, thereby determining a width of said recess.

3. The method of claim 1, wherein, prior to performing the second selective deposition process to form the first etch protection material, the method comprises performing a surface treatment so as to reduce a deposition rate for said first dielectric material as compared to said conductive cap layer for a subsequent deposition process.

4. The method of claim 1, further comprising removing said first etch protection material and said second etch protection material at least from said conductive cap layer after forming said recess.

5. The method of claim 4, wherein said first etch protection material and said second etch protection material are removed at least from said conductive cap layer prior to depositing said second dielectric material.

6. The method of claim 4, wherein said first etch protection material and said second etch protection material are removed at least from said conductive cap layer after depositing said second dielectric material.

7. The method of claim 6, wherein said first etch protection material, said second etch protection material, and excess material of said second dielectric material are removed together by performing a planarization process.

8. The method of claim 1, wherein a material composition of said conductive cap layer is selected so as to form an interface of increased electromigration strength with said metal lines.

9. The method of claim 1, wherein a material composition and a thickness of said first etch protection material and said second etch protection materials are selected so as to avoid exposure of said conductive cap layer when forming said recess.

10. The method of claim 1, wherein said first and second etch protection materials comprise two or more material layers of different material composition.

11. The method of claim 1, wherein each conductive cap layer is aligned with the metal line and at least one barrier layer in which the metal line is nested.

* * * * *